United States Patent
Avrutsky et al.

(10) Patent No.: US 9,007,210 B2
(45) Date of Patent: Apr. 14, 2015

(54) ENHANCED SYSTEM AND METHOD FOR THEFT PREVENTION IN A SOLAR POWER ARRAY DURING NONOPERATIVE PERIODS

(75) Inventors: Mordechay Avrutsky, Alfei Menashe (IL); Ron Hadar, Cupertino, CA (US); Shmuel Arditi, Los Gatos, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 179 days.

(21) Appl. No.: 13/092,099

(22) Filed: Apr. 21, 2011

(65) Prior Publication Data
US 2011/0260866 A1 Oct. 27, 2011

Related U.S. Application Data

(63) Continuation-in-part of application No. 12/895,745, filed on Sep. 30, 2010, now Pat. No. 8,773,236, and a continuation-in-part of application No. 12/985,883, filed on Jan. 6, 2011, now Pat. No. 8,271,599.

(60) Provisional application No. 61/343,154, filed on Apr. 22, 2010.

(51) Int. Cl.
*G06F 11/34* (2006.01)
*G06Q 10/06* (2012.01)
*H01L 31/02* (2006.01)
*G06F 11/14* (2006.01)

(52) U.S. Cl.
CPC ...... *H01L 31/02021* (2013.01); *G06F 11/1443* (2013.01); *Y02E 10/50* (2013.01)

(58) Field of Classification Search
CPC ............ G06F 11/3409; G06F 11/3447; G06F 2201/88; G06Q 10/06; G05B 23/02
See application file for complete search history.

(56) References Cited

U.S. PATENT DOCUMENTS

| | | | |
|---|---|---|---|
| 4,888,702 A | * | 12/1989 | Gerken et al. ................. 700/295 |
| 5,235,266 A | | 8/1993 | Schaffrin |
| 5,268,832 A | | 12/1993 | Kandatsu |
| 5,604,430 A | | 2/1997 | Decker et al. |
| 5,923,158 A | | 7/1999 | Kurokami et al. |
| 6,275,016 B1 | | 8/2001 | Ivanov |
| 6,448,489 B2 | | 9/2002 | Kimura et al. |

(Continued)

FOREIGN PATENT DOCUMENTS

| | | | | |
|---|---|---|---|---|
| AU | 2005262278 | | 7/2005 | |
| CA | 2704605 | * | 5/2009 | ............. G08B 13/14 |

(Continued)

OTHER PUBLICATIONS

Canadian Patent Application No. CA 2704605 English Title: Anti-Theft Monitoring Device and a Method for Monitoring an Electrical Appliance, Especially a Solar Module, Abstract, Patent Details, Images, All Claims included & available at URL http://brevets-patents.ic.gc.ca/opic-cipo/cpd/eng/patent/2704605, See Item N, p. 1, PTO-892 above.*

(Continued)

*Primary Examiner* — Andrew Lai
*Assistant Examiner* — Hoyet H Andrews
(74) *Attorney, Agent, or Firm* — Greenberg Traurig LLP

(57) ABSTRACT

Solar panel theft protection system operable both during daytime and nighttime. Power is feed into a solar array system sufficient to operate local management units. The units monitor solar panels; in the event that a panel is disconnected, an alarm is set off.

20 Claims, 10 Drawing Sheets

(56) References Cited

U.S. PATENT DOCUMENTS

| | | | |
|---|---|---|---|
| 6,650,031 B1 | 11/2003 | Goldack | |
| 6,844,739 B2 | 1/2005 | Kasai et al. | |
| 6,894,911 B2 | 5/2005 | Telefus et al. | |
| 6,984,970 B2 | 1/2006 | Capel | |
| 6,996,741 B1 | 2/2006 | Pittelkow et al. | |
| 7,061,214 B2 | 6/2006 | Mayega et al. | |
| 7,161,082 B2* | 1/2007 | Matsushita et al. | 136/244 |
| 7,248,946 B2 | 7/2007 | Bashaw et al. | |
| 7,256,566 B2 | 8/2007 | Bhavaraju et al. | |
| 7,276,886 B2 | 10/2007 | Kinder | |
| 7,518,346 B2 | 4/2009 | Prexl | |
| 7,595,616 B2 | 9/2009 | Prexl | |
| 7,602,080 B1* | 10/2009 | Hadar et al. | 307/20 |
| 7,605,498 B2 | 10/2009 | Ledenev et al. | |
| 7,719,140 B2 | 5/2010 | Ledenev et al. | |
| 7,991,378 B2 | 8/2011 | Lindoff et al. | |
| 8,179,147 B2* | 5/2012 | Dargatz et al. | 324/536 |
| 8,271,599 B2* | 9/2012 | Eizips et al. | 709/206 |
| 8,304,932 B2* | 11/2012 | Ledenev et al. | 307/82 |
| 8,380,126 B1 | 2/2013 | Ma et al. | |
| 8,473,250 B2* | 6/2013 | Adest et al. | 702/182 |
| 8,581,441 B2* | 11/2013 | Rotzoll et al. | 307/82 |
| 8,773,236 B2 | 7/2014 | Makhota et al. | |
| 2004/0056768 A1* | 3/2004 | Matsushita et al. | 340/541 |
| 2005/0057214 A1 | 3/2005 | Matan | |
| 2005/0057215 A1 | 3/2005 | Matan | |
| 2006/0001406 A1 | 1/2006 | Matan | |
| 2006/0174939 A1 | 8/2006 | Matan | |
| 2006/0185727 A1 | 8/2006 | Matan | |
| 2007/0273351 A1 | 11/2007 | Matan | |
| 2008/0097655 A1 | 4/2008 | Hadar et al. | |
| 2008/0121272 A1 | 5/2008 | Besser et al. | |
| 2008/0122449 A1 | 5/2008 | Besser et al. | |
| 2008/0122518 A1 | 5/2008 | Besser et al. | |
| 2008/0179949 A1 | 7/2008 | Besser et al. | |
| 2008/0191560 A1 | 8/2008 | Besser et al. | |
| 2008/0191675 A1 | 8/2008 | Besser et al. | |
| 2008/0303503 A1 | 12/2008 | Wolfs | |
| 2009/0012917 A1* | 1/2009 | Thompson et al. | 705/412 |
| 2009/0066357 A1* | 3/2009 | Fornage | 324/765 |
| 2009/0179662 A1 | 7/2009 | Moulton et al. | |
| 2009/0242011 A1* | 10/2009 | Proisy et al. | 136/244 |
| 2009/0283130 A1 | 11/2009 | Gilmore et al. | |
| 2009/0309727 A1* | 12/2009 | Rice | 340/568.1 |
| 2010/0115093 A1 | 5/2010 | Rice | |
| 2010/0139734 A1* | 6/2010 | Hadar et al. | 136/244 |
| 2010/0191383 A1 | 7/2010 | Gaul | |
| 2010/0207764 A1* | 8/2010 | Muhlberger et al. | 340/568.1 |
| 2010/0295680 A1* | 11/2010 | Dumps | 340/568.1 |
| 2010/0301991 A1* | 12/2010 | Sella et al. | 340/3.1 |
| 2010/0321148 A1 | 12/2010 | Gevorkian | |
| 2011/0012430 A1* | 1/2011 | Cheng et al. | 307/82 |
| 2011/0105094 A1 | 5/2011 | Hassan et al. | |
| 2011/0161722 A1* | 6/2011 | Makhota et al. | 714/4.2 |
| 2011/0172842 A1* | 7/2011 | Makhota et al. | 700/292 |
| 2011/0173276 A1 | 7/2011 | Eizips et al. | |
| 2011/0210612 A1* | 9/2011 | Leutwein | 307/80 |
| 2011/0246338 A1* | 10/2011 | Eich | 705/28 |
| 2011/0260866 A1* | 10/2011 | Avrutsky et al. | 340/568.1 |
| 2012/0215367 A1 | 8/2012 | Eizips et al. | |
| 2013/0332093 A1* | 12/2013 | Adest et al. | 702/60 |

FOREIGN PATENT DOCUMENTS

| | | |
|---|---|---|
| DE | 4232356 | 3/1994 |
| DE | 19961705 | 7/2001 |
| EP | 1388774 | 2/2004 |
| EP | 2061088 | 5/2009 |
| ES | 2249147 | 3/2006 |
| WO | 03012569 | 2/2003 |
| WO | WO 2007048421 A2 * | 5/2007 |
| WO | 2009056957 | 5/2009 |
| WO | WO 2009056957 A2 * | 5/2009 |

OTHER PUBLICATIONS

J. Keller and B. Kroposki, titled, "Understanding Fault Characteristics of Inverter-Based Distributed Energy Resources", in a Technical Report NREL/TP-550-46698, published Jan. 2010, pp. 1 through 48.*

Canadian Patent Application No. CA 2704605, Title: Anti-Theft Monitoring Device and a Method for Monitoring an Electrical Appliance, Especially a Solar Module, Abstract, Patent Details, Images, All Claims included & available at URL http://brevets-patents.ic.gc.ca/opic-cipo/cpd/eng/patent/2704605, See Item O and K, p. 1, PTO-892 above.*

International Patent Application No. PCT/US2011/020591, International Search Report and Written Opinion, Aug. 8, 2011.

International Patent Application No. PCT/US2011/033544, International Search Report and Written Opinion, Nov. 24, 2011.

Alonso, R. et al., "A New Distributed Converter Interface for PV Panels," 20th European Photovoltaic Solar Energy Conference, Barcelona, Spain, pp. 2288-2291, Jun. 6-10, 2005.

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Euronsun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

* cited by examiner

ENHANCED SYSTEM AND METHOD FOR THEFT PREVENTION IN A SOLAR POWER ARRAY DURING NONOPERATIVE PERIODS

CROSS-REFERENCE TO RELATED APPLICATIONS

The present application claims priority to U.S. Provisional Application Ser. No. 61/343,154, filed Apr. 22, 2010, entitled "ENHANCED SYSTEM AND METHOD FOR THEFT PROTECTION IN A SOLAR POWER ARRAY DURING NONOPERATIVE PERIODS," by Avrutsky et al., the entire contents of which application are incorporated by reference in their entirety as if fully set forth herein.

The present application is a continuation-in-part of U.S. patent application Ser. No. 12/895,745, filed Sep. 30, 2010, entitled "SYSTEMS AND METHODS FOR A COMMUNICATION PROTOCOL BETWEEN A LOCAL CONTROLLER AND A MASTER CONTROLLER," by Makhota et al., the entire contents of which application are incorporated by reference as if fully set forth herein.

The present application is a continuation-in-part of U.S. patent application Ser. No. 12/985,883, filed Jan. 6, 2011, entitled "SYSTEMS AND METHODS FOR AN IDENTIFICATION PROTOCOL BETWEEN A LOCAL CONTROLLER AND A MASTER CONTROLLER," by Eizips et al., the entire contents of which application are incorporated by reference as if fully set forth herein.

COPYRIGHT NOTICE AND PERMISSION

A portion of the disclosure of this patent document contains material which is subject to copyright protection. The copyright owner has no objection to the facsimile reproduction by anyone of the patent document or the patent disclosure, as it appears in the patent and trademark office patent file or records, but otherwise reserves all copyright rights whatsoever.

FIELD OF INVENTION

The present invention relates to the field of preventing theft of solar panels.

BACKGROUND

The protocol of the local management unit (LMU) in a photovoltaic energy system is very important. In particular, the protocol must be able to recover from all kinds of errors. It must be self-adjusting, for example, in the case of errors and other problems, and it must maintain certain safety aspects at all times, such as maximum voltage and other desired parameters.

As communications between local controllers and the master controller in a photovoltaic energy system are important to maintain optimal MPPT (maximum power point tracker), it is important to ensure that these communications, as well as the components of the system, are secure.

Most theft-protection systems for solar panels require power. However, at night, the solar panels are dark, and therefore they generate no power. Hence, in many cases, theft protection systems may not work.

BRIEF SUMMARY OF THE INVENTION

A solar panel system includes one or more solar panels interconnected to one or more local management units. A controller is interconnected to a power supply which is independent of the panels, with the power supply feeding power to the local management units. This enables the local management units to operate during periods of panel shutdown (e.g., during nighttime) and to query the respective panels. If one or more of the panels do not respond, then the local management unit raises an alarm.

These and other objects and advantages of the present invention will become clear to those skilled in the art in view of the description of the best presently known mode of carrying out the invention and the industrial applicability of the preferred embodiment as described herein.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

The use of headings herein are merely provided for ease of reference, and shall not be interpreted in any way to limit this disclosure or the following claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

What is needed is a system and method to fail-safe the operations of distributed local management units in a photovoltaic energy system.

Figure 1:
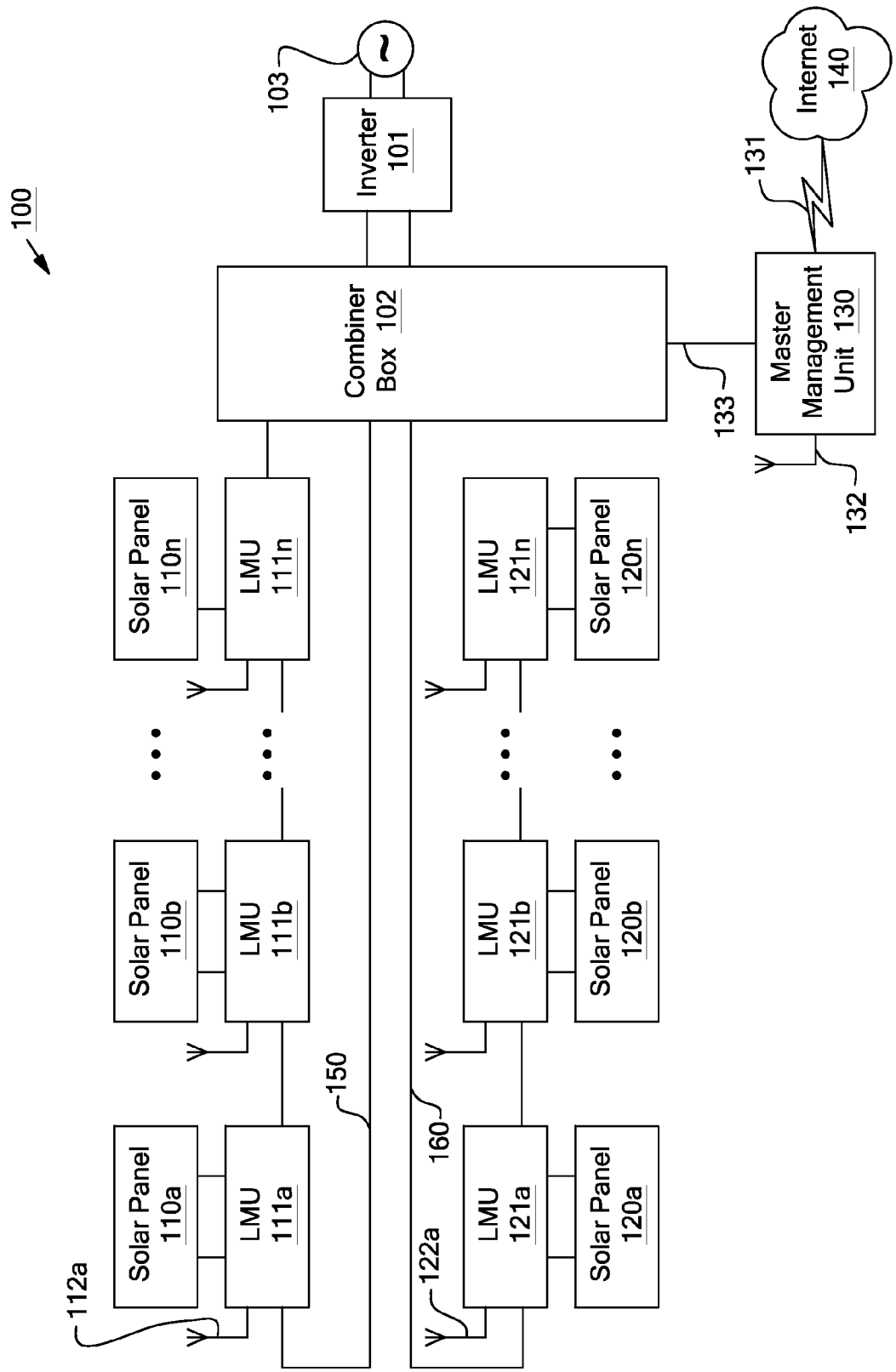
FIG. 1 shows an overview of a system according to an embodiment of this invention.

FIG. 1 shows an overview of an exemplary system 100 according to one aspect of the system and method disclosed herein. System 100 contains two exemplary strings of panels, namely string 110a-n and string 120a-n. Each panel in each string has its own local management unit (local controller), which, in this exemplary illustration, are units 111a-n and 121a-n, respective to the strings named above. Each LMU has an antenna; in this exemplary illustration, only antenna 122a is noted, for simplicity and clarity. Combiner box 102 is typically used to combine the output of said multiple strings of panels. Master management unit (MMU; Master controller) 130 acts as a gateway, connecting to the Internet 140, via connection 131, which may be wired, land line, Ethernet, wireless, or any other of various types of connection that are currently known or may be known in the future. In this example, MMU 130 has an antenna 132, which is used to communicate with distributed LMUs. Power line 133 may supply power to MMU 130, and in some cases, it could also transmit communications via power line communication between the MMU and LMUs, instead of using wireless communication. However, even power line communication has problems similar to wireless communication, such as UF interferences and other effects that may require channel selection. One example of power line communication is discussed in U.S. patent application Ser. No. 12/467,117, filed May 15, 2009, entitled "Method and System for Current-Mode Power Line Communications," the entire contents of which application are incorporated by reference as if fully set forth herein.

Figure 2:
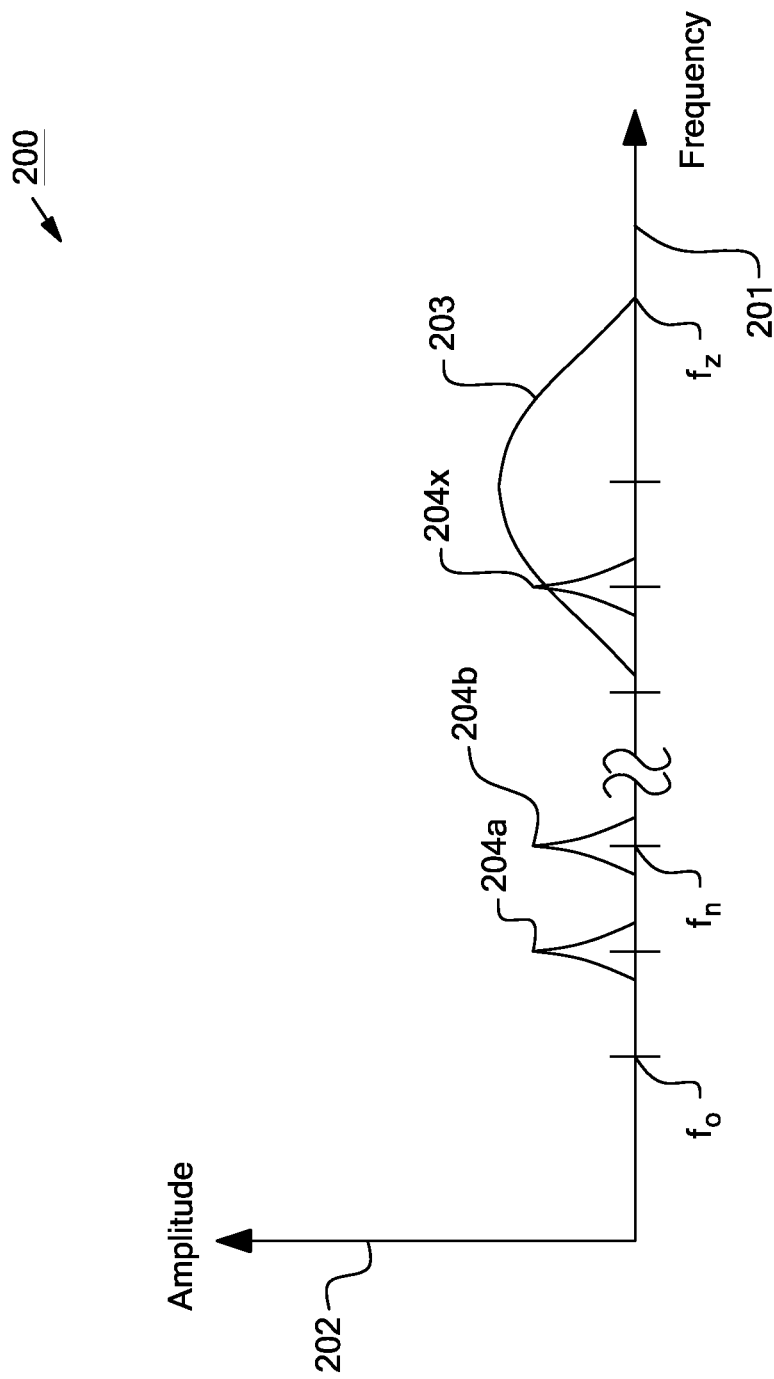
FIG. 2 illustrates a graph of relationships of frequency vs. amplitude.

FIG. 2 shows a graph of the relationships 200 of frequency vs. amplitude, with amplitude axis 202 and frequency axis 201. Shown on frequency axis 201 are a number of channels f0-fz, with channel fn the actual channel in use. Also shown are exemplary signals 204a, 204b, and 204x. In this example, a number of channels are covered by a disturbing interference 203.

Figure 3:
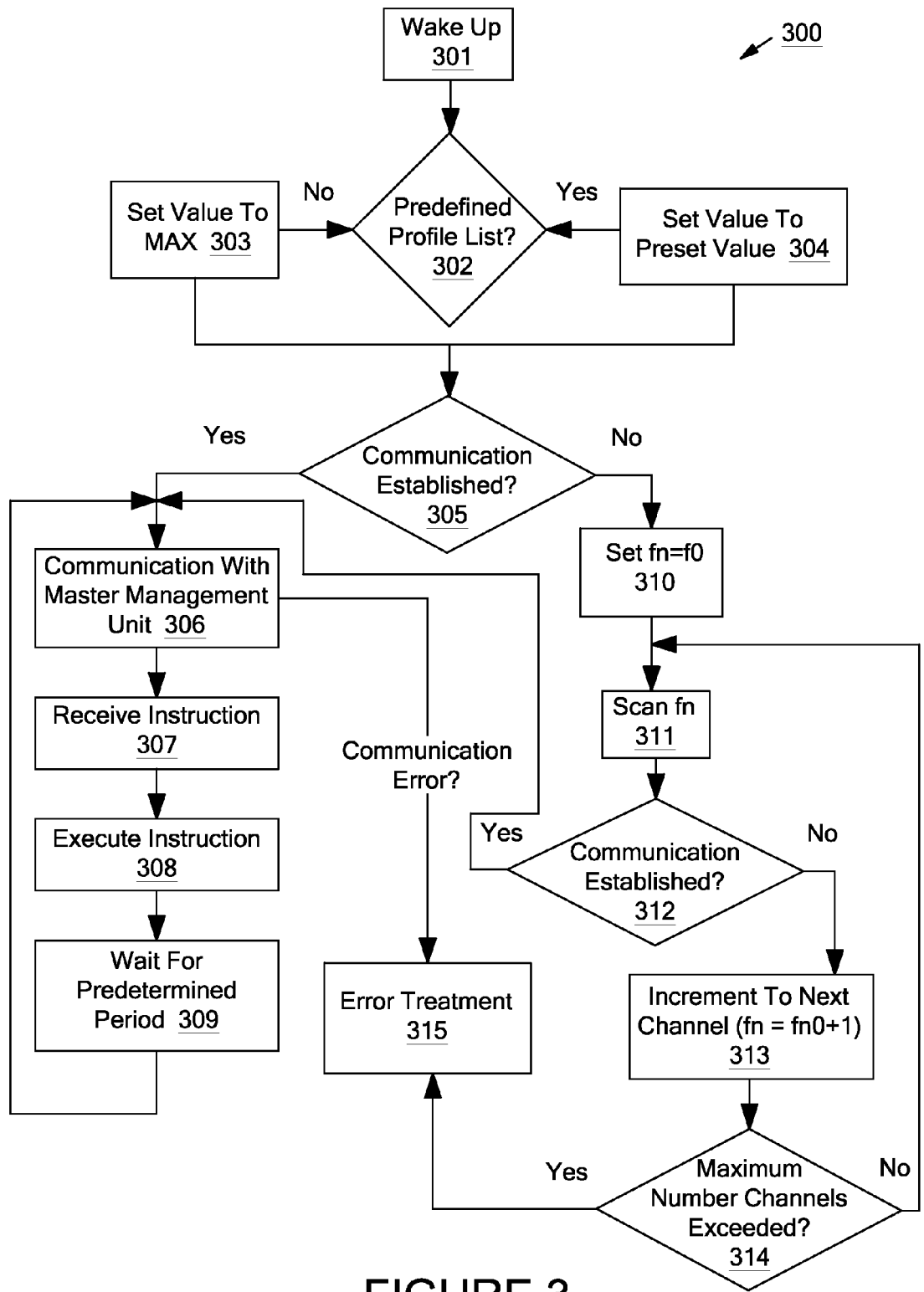
FIG. 3 illustrates a process for implementation of a system and method in an exemplary local management unit (LMU).

FIG. 3 shows an exemplary process 300 for implementation of the system and method in an exemplary LMU, according to one aspect of the system and method disclosed herein. In step 301, the unit wakes up. In step 302, the system checks to determine whether it has a predefined profile list of starting values. If not (no), in step 303, the system sets a maximum value, typically for the output voltage that particular LMU contributes to its string, except in cases where local regulations require that the value be set lower than the maximum. If system finds a preset value in a profile (yes), in step 304 the system sets the LMU at the preset value. Once the value is set in either step 303 or step 304, in step 305 the system checks to determine whether communication with the MMU has been established. If communication is established (yes), in step 306 the system communicates with the MMU in step 306 and in step 307, it receives instructions. In step 308, the system executes the instructions it has received. In step 309, the system waits for a period whose value contained in its profile list, and then it repeats the communication loop beginning again at step 306. In cases where a communication error occurs in step 306, the system moves to step 315 and commences an error treatment protocol, described below. If the system finds, in step 305, that communication is not established (no), in step 310 the system attempts to establish communication by setting the channel fn to the frequency of the initial channel f0 and, in step 311, scanning fn. In step 312, the system checks to see if communication is then established. If it is (yes), the system continues to the sequence of steps starting with step 306. If, in step 312, communication is not established (no), in step 313 increments the active channel fn to the next available channel f0+1; i.e., channel f1. In step 314, the system checks to see if the next incremented channel exceeds the maximum number of available channels. If the maximum is not exceeded (no), the system returns to step 311 and continues to scan succeeding channels until either it establishes communication or it exceeds the maximum number of channels. In the case of exceeding the maximum number of available channels in step 314 (yes), the system moves to step 315 and commences an error treatment protocol.

An error treatment protocol may include one or more of various approaches. One typical approach would reset the LMU and start again at step 301. Another approach would shut down the LMU; while yet another would loop back to step 305 and try again. Appendix A shows an example of the protocol of communications between an exemplary distributed LMU and an exemplary MMU. It shows how a system can self detect elements, available channels etc, greatly reducing setup efforts. This is particularly important with the use of wireless communications, as channels may be blocked by outside sources of interference, and the system has to be able to self reconfigure.

Figure 4:
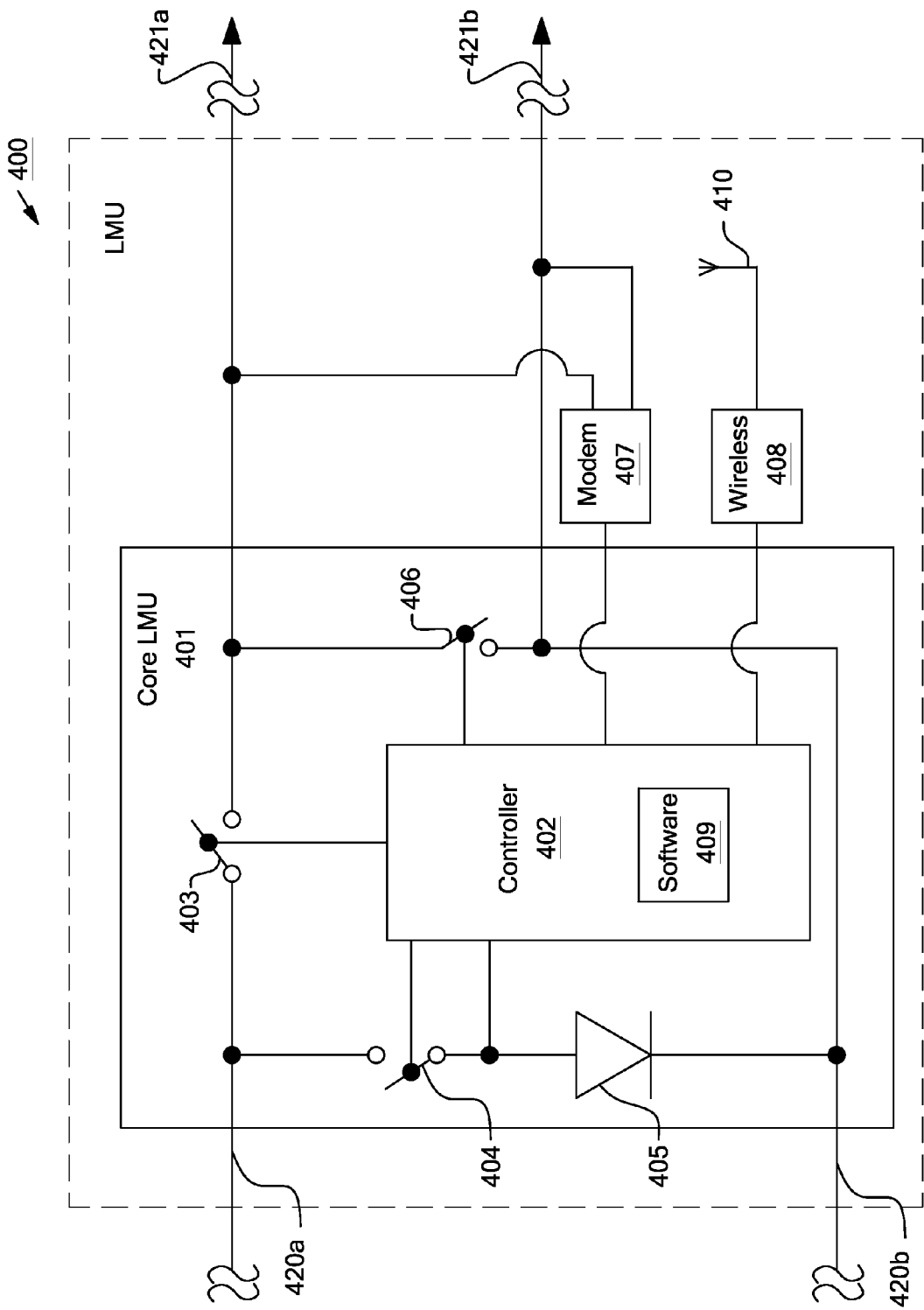
FIG. 4 illustrates an exemplary LMU.

FIG. 4 shows an exemplary local controller or LMU 400, similar to an example discussed in U.S. patent application Ser. No. 13/073,915, filed Mar. 28, 2011, entitled "SYSTEMS AND METHODS FOR REMOTE OR LOCAL SHUT-OFF OF A PHOTOVOLTAIC SYSTEM," the entire contents of which application are incorporated by reference as if fully set forth herein. Core LMU 401 has switches 403, 404 and 406, plus controller 402. A diode 405 provides a voltage drop in the case of a short of switch 404, to ensure enough voltage to operate controller 402. In some cases, modem 407 connects to the string wiring 421a,b. In other cases, wireless network interface 408 has an antenna 410. The network may be one of many different types of wireless networks. In most cases, an LMU does not have both a modem 407 and a wireless network interface 408. Typically, a system contains only one or the other, but in some cases, these may be plug in modules, or in other cases, both may be present but only one may be activated. The modified processor 402 contains additional software code 409 that includes, in addition to previously discussed features, code that is part of the shutoff system of the current invention.

Figure 5:
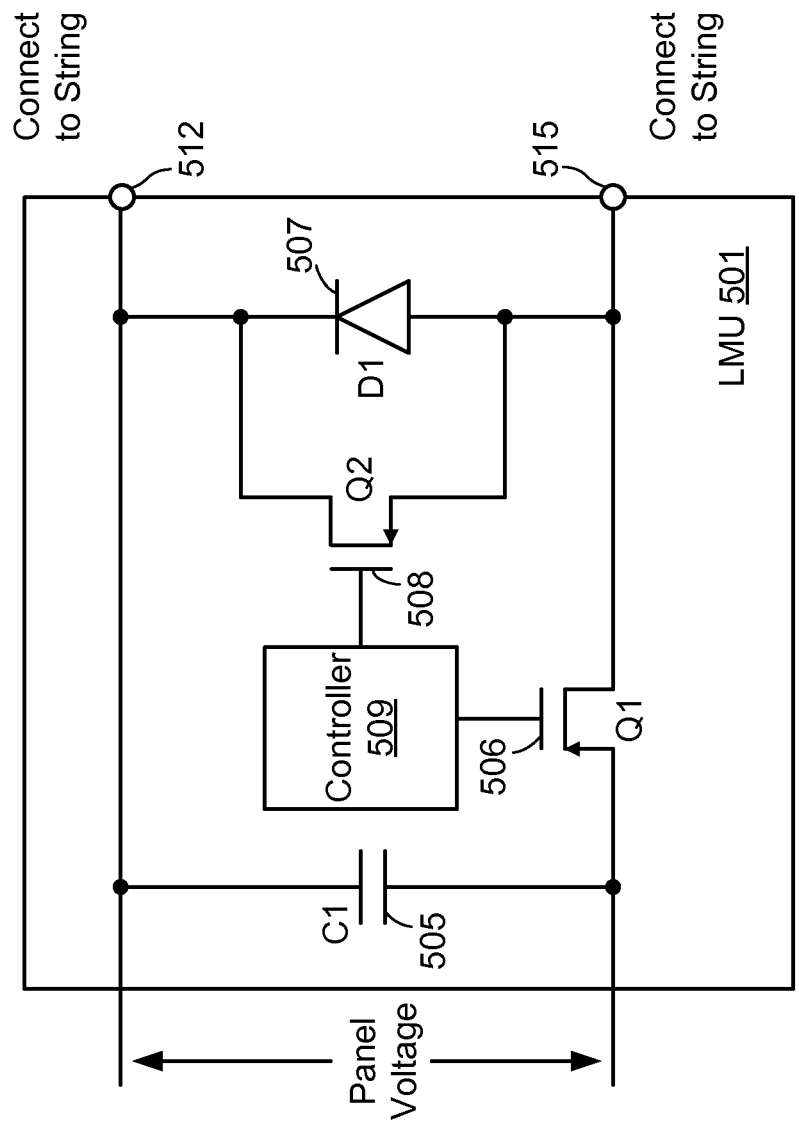
FIG. 5 illustrates a LMU with two connectors for serial connection with another LMU.

In FIG. 5, the local management unit 501 provides two connectors 512 and 515 for serial connections with other local management unit 501 to form a serial power bus, e.g., 150 or 160 illustrated in FIG. 1. The controller 509 controls the states of the switches Q1 506 and Q2 508. When the controller 509 turns on the switch 506, the panel voltage and the capacitor C1 505 are connected in parallel to the connectors 512 and 515. The output voltage between the connectors 512 and 515 is substantially the same as the output panel voltage. During the period the switch 506 is turned off (open), the controller 509 turns on (closes) the switch 508 to provide a path around the diode D1 507 to improve efficiency. When the switch 506 is turned off (open), the panel voltage charges the capacitor C1 505, such that when the switch 506 is turned on, both the solar panel and the capacitor 505 provides currents going through the connectors 512 and 515, allowing a current larger than the current of the solar panel to flow in the string (the serial power bus, e.g., 150 or 160 illustrated in FIG. 1). When the switch 506 is turned off (open), the diode D1 507 also provides a path between the connectors 512 and 515 to sustain the current in the string, even if the switch 508 is off for some reasons. In one embodiment, the controller 509 is connected (not shown) to the panel voltage to obtain the power for controlling the switches Q1 506 and Q2 508. In one embodiment, the controller 509 is further connected (not shown) to at least one of the connectors to transmit and/or receive information from the string. In one embodiment, the controller 509 includes sensors (not shown) to measure operating parameters of the solar panel, such as panel voltage, panel current, temperature, light intensity, etc.

Figure 6:
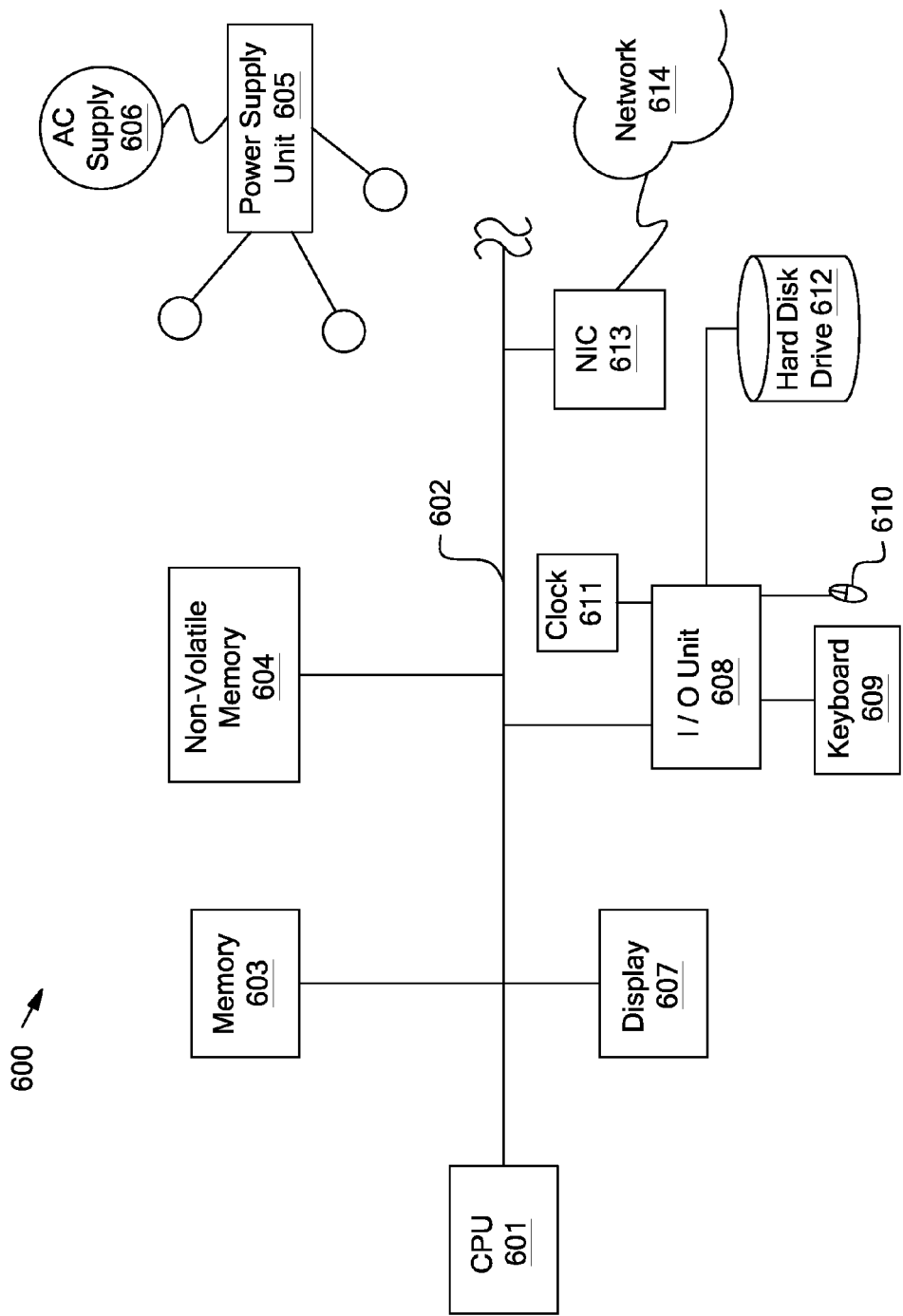
FIG. 6 illustrates an overview of a computer system which can be used in various portions of the system as illustrated in FIG. 1.

FIG. 6 shows an exemplary overview of a computer system 600 as may be used in any of the various locations throughout system 100. It is exemplary of any computer that may execute code to process data. Various modifications and changes may be made to computer system 600 without departing from the broader spirit and scope of the system and method disclosed herein. CPU 601 is connected to bus 602, to which bus is also connected memory 603, nonvolatile memory 604, display 607, I/O unit 608, and network interface card (NIC) 613. I/O unit 608 may, typically, be connected to keyboard 609, pointing device 610, hard disk 612, and real-time clock 611. NIC 613 connects to network 614, which may be the Internet or a local network, which local network may or may not have connections to the Internet. Also shown as part of system 600 is power supply unit 605 connected, in this example, to ac supply 606. Not shown are batteries that could be present, and many other devices and modifications that are well known but are not applicable to the specific novel functions of the system and method disclosed herein.

What is needed is a system and method that secures communications and verifies that the panels are legitimate, registered panels for use in a photovoltaic energy system, while at the same time securing the components of said photovoltaic system, such as the local controllers on the panels and the master controller, from mischief and mistakes such as, for example, interference by an outside entity or using incorrect panels in the system.

Figure 7:
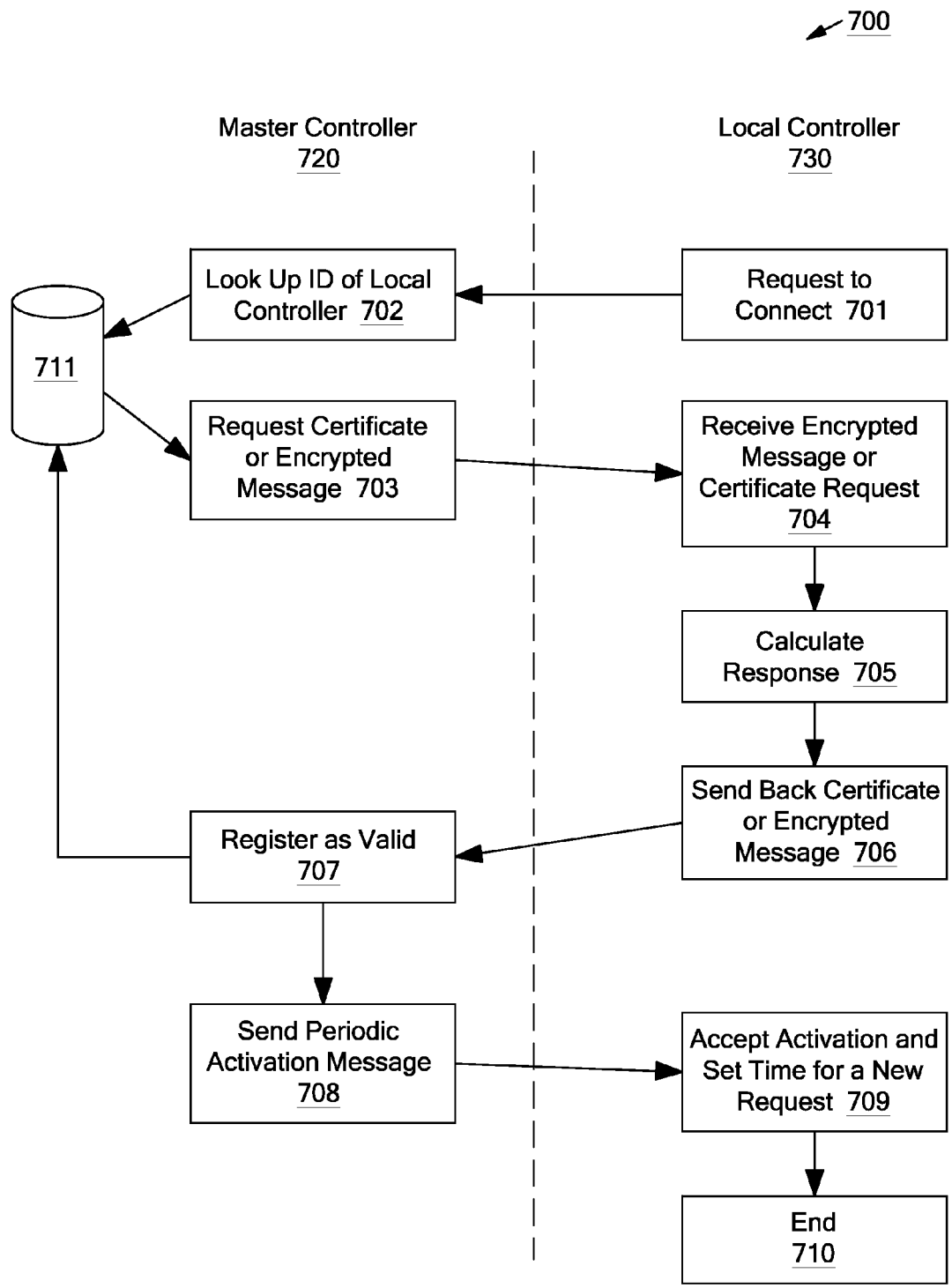
FIG. 7 illustrates an embodiment of communication process between a master management unit (MMU) and a LMU.

FIG. 7 shows an exemplary communication process 700 between a master controller (master management unit or MMU) and a local controller (local management unit or LMU), according to one aspect of the system and method disclosed herein. In step 701 the LMU requests a connection. In step 702, the MMU looks up the LMU's ID in data repository 711, which repository may be a local storage device in the MMU, or it may be a remote storage device accessible to the MMU via connection 131 (not shown, see description in discussion of FIG. 1) or some other, similar means. In step 703 a MMU requests a certificate or sends an encrypted message to the LMU. In some cases the system may employ, for example, SSL-type certificates, which are distributed at the time the unit is set up. In other cases, the system may use encrypted communication in lieu of a certificate, where, for example, the MAC ID of the unit may be used to create an encryption algorithm, thus creating a pseudo-certificate. In yet other cases a modem or other communication device may be used, which device provides a transparent communication link in the style of a virtual private network (VPN). In step 704, the LMU receives the certificate or encrypted message. In step 705, the LMU calculates a response, which response depends on the type of message receive in step 704. In step 706, the LMU sends back the encrypted message. If this panel is not the panel it is supposed to be, or if it sends back an incorrect certificate, in step 707 the MMU notes that the registration is Invalid (not shown). If the message contains data that validates the panel, the MMU registers this panel as valid, and in step 708 it sends a periodic activation message back to the LMU, keeping the LMU functional. In the absence of such a signal, the LMU could, for example turn off, or go to a low-level production. Hence, if a panel were stolen, the LMU would cease to work properly if it does not receive such periodic activation messages. In step 709 the LMU accepts the activation and sets a duration time for the activation period, after which the activation expires and the LMU sends a new request. In step 710 the communication process ends.

Figure 8:
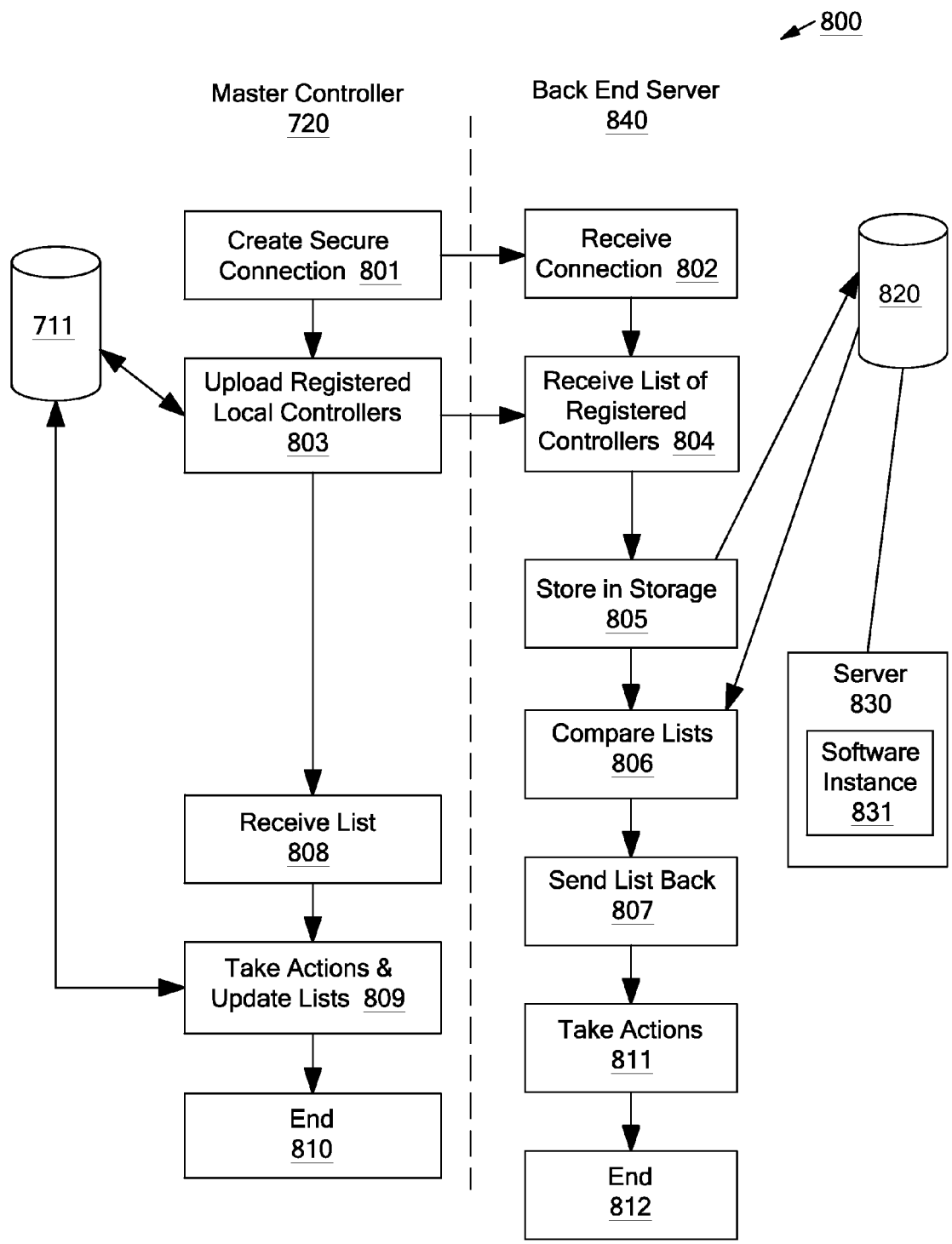
FIG. 8 illustrates an embodiment of data flow process between an MMU and a back end server.

FIG. 8 shows an exemplary data flow process 800 between a master controller (master management unit or MMU) and a back end server, according to one aspect of the system and method disclosed herein. Such back end servers have been previously discussed in U.S. patent application Ser. No. 11/875,799, filed Oct. 19, 2007, U.S. patent application Ser. No. 12/254,780, filed Oct. 20, 2008 (now U.S. Pat. No. 7,884, 278), and U.S. patent application Ser. No. 12/411,317, filed Mar. 25, 2009 (now U.S. Pat. No. 7,602,080), the entire contents of which applications are incorporated by reference as if fully set forth herein. In step 801 the system creates a secure connection from the MMU to server 830, which is running software instance 831. In step 802 the server receives the connection. In step 803 the MMU uploads its list of registered local controllers and, optionally in some cases, also data about local controllers that have been determined to be invalid. In step 804, the server receives the list, and in step 805, the list is stored into the server's main storage repository 820. In step 806, the system compares the newly received list to its previous lists of missing panels, incorrect panels, unregistered panels, etc. In step 807, the server sends back its updated list to the MMU. In step 811, the system may take additional actions, such as notifying the operator about incorrect, missing, or unregistered panels, or the reasons for refusing certain panels, and in step 812 the process at the server ends. Meanwhile, in step 808 the MMU, which lies between a backend server that may be located, for example, at a service provider, and the LMU, receives the updated list, and in step 809 the MMU may take actions, such as excluding certain panels that may be in the wrong system or may be the wrong type and could thus be damaged or damage some other components. The data flow process 800 could be used, for example, to exclude stolen panels that are from another system and are not registered to operate in the present system. In such cases, actions in steps 809 and 811 could include notifying the operators of the system from which panels were stolen, the operators of the present system, the operator of the server, and in some cases, even the authorities. In step 810, the process at the MMU ends.

What is needed is a system and method that can help theft prevention by feeding power from a source such as, for example, an auxiliary power supply, into the solar panel system. Such a power feed could be, for example, a reverse dc low-voltage feed that could wake up the local management units (LMUs) or other theft-protection units (TPUs), the latter of which may be separate local units, or integrated into the former at the panels for interaction with a central control unit. In some cases the units could be always on; in other cases the units could wake up from time to time. In yet other cases, to further save power, the auxiliary power would only be injected from time to time as needed, or even on a segment-by-segment basis. In some cases this auxiliary power may be a much lower voltage than the normal operational voltage is, just sufficient to operate the LMUs. In other cases, it may be the normal operational voltage, but the inverter is inhibited or shut-off by the MMU. Also, in some cases, an additional signal maybe injected on top of the voltage as a signal of a special state. Additional hardware may be needed to inject power only into one or more selected sections of a system. Should a panel be disconnected from the string in the process of a theft attempt, said panel obviously could not participate in an interaction, and therefore an alarm would be set off, for example, so a security guard could investigate in person, or look at video camera feeds, or use other inspection measures.

Figure 9:
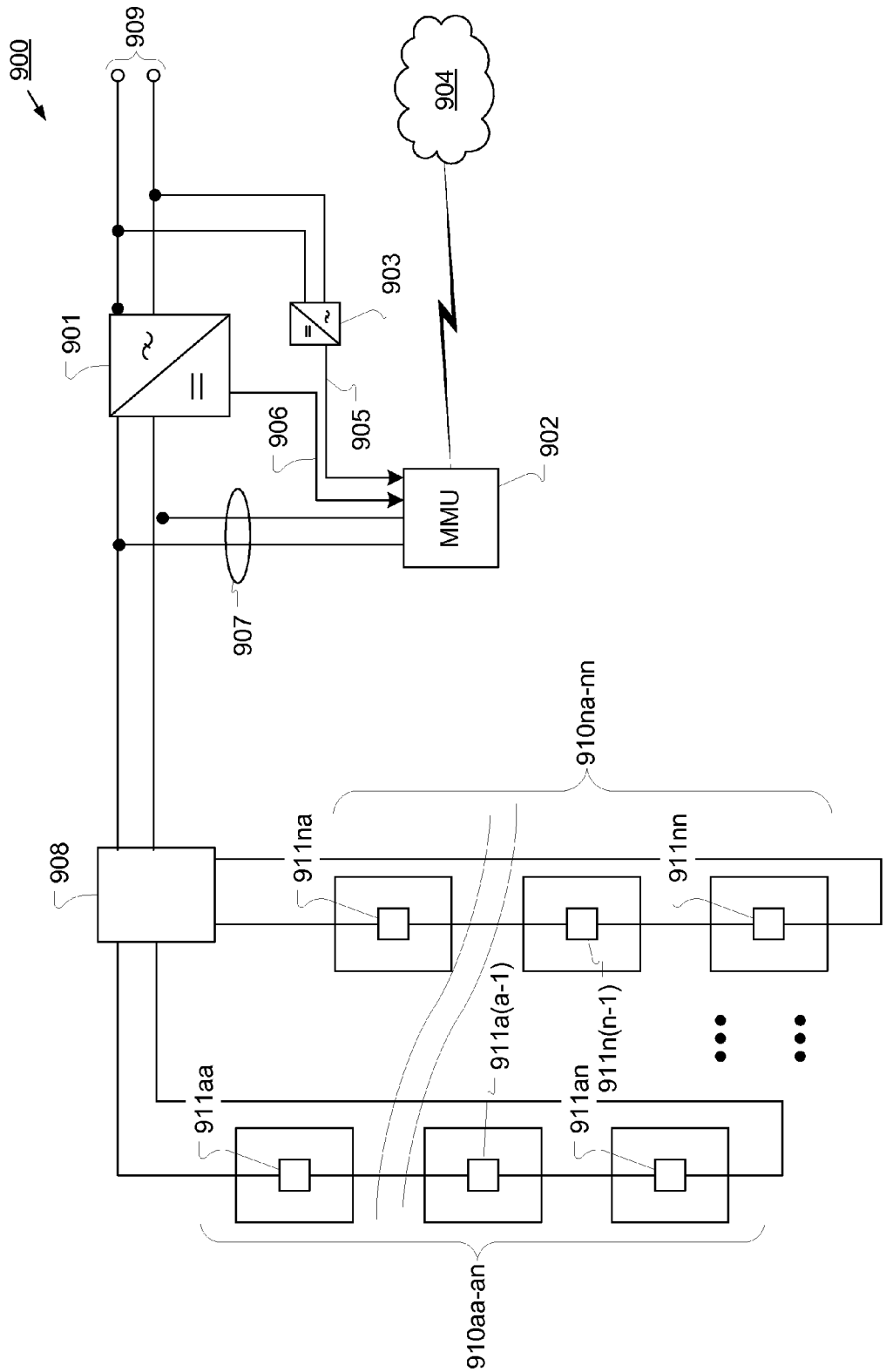
FIG. 9 illustrates an embodiment of a system according to one aspect of the invention described herein.

FIG. 9 shows an exemplary system 900 according to one aspect of the system and method disclosed herein. Solar panels 910aa-nn are installed in multiple strings. The outputs of the strings are typically joined in combiner box 908, which then connects to inverter 901, which in turn connects to power grid 909. As mentioned earlier, additional hardware (not shown) such as relays or semiconductor switching elements with an additional local controller may be provided, to allow each string to be powered up individually, thus reducing energy and power needed to poll panels or their respective local units. This example shows, for reasons of simplicity and clarity, only a single-phase power grid, but the power grid could be a much large and more complex multi-phase power grid. Also shown is a master management unit (MMU) 902 (in some cases, a separate, dedicated theft prevention controller may exist, or as in the discussion here, it may be combined with the MMU's hardware and integrated with the MMU's software) and an auxiliary power supply 903, which connects directly to the power grid and which can, via feed route 905, provide energy into MMU 902. MMU 902 connects via lines 907 to the dc wiring system and can, therefore, feed back dc current to the solar panel array, via the combiner box(es) 908 (only one shown) to the panels and their respective LMUs or theft protection units (TPUs). In other cases an auxiliary power supply may connect directly to the dc wiring between combiner box 908 and inverter 901. Wiring 906 allows the MMU 902 to interact with the inverter 908 and, for example, suppress false starts of the inverter on the auxiliary voltage. MMU 902 or some other, similarly suitable controller, may, for example, turn on only the dc voltage every two or three minutes for a few seconds, thus sending just enough current to wake up the LMUs 911$aa$-$nn$ in the panels and allow them to do a quick query, each of their respective panels. Then if, for example, two minutes later, one of the units does not respond to the query, the system would send an alarm indicating a possible security breach, such as a wire being cut or a panel being removed. In some cases, before sending an alarm, a re-test may be done, to verify that the alarm is caused by a non-responding or removed panel, rather than just a temporary problem polling a unit.

Figure 10:
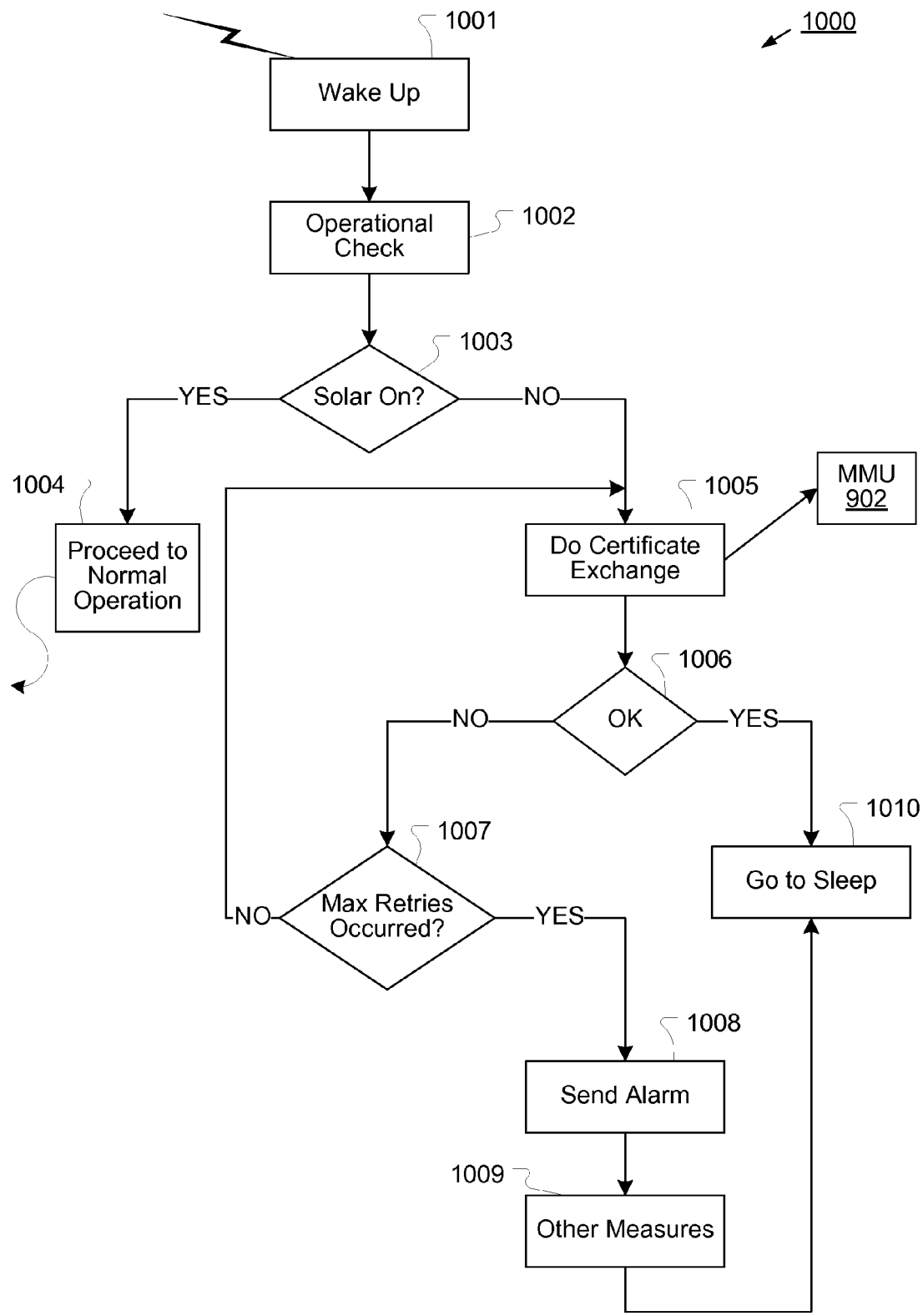
FIG. 10 illustrates an embodiment of a process implemented by a software instance inside an LMU.

FIG. 10 shows an exemplary process 1000 implemented by a software instance inside the LMU (or TPU; for this discussion both shall be deemed interchangeable) to interact with the MMU (or a dedicated theft prevention controller; for this discussion both shall be deemed interchangeable), according to one aspect of the system and method disclosed herein. In step 1001 the local LMU, or other similar theft protection device, wakes up in response to stimulus from the software (e.g., alarm clock) or external stimulus to the software, for example, a signal added to the injected power, or a query sent from the MMU or similar theft prevention controller. In step 1002, the software in the LMU performs an operational check. At step 1003 it is determined whether the LMU is operating in standard solar-system power-generating mode (yes), or some other nonoperational mode (no). If yes, the process moves to step 1004, where the LMU continues in standard operation. If no, the process moves to step 1005, where the LMU software initiates a certificate exchange with MMU 902, notifying the MMU in a secure manner that the LMU is still connected to the solar network. In step 1006, after the certificate exchange, the software checks the results of the exchange, such as a response, sometimes validated with a certificate, or by doing a secure exchange. The latter is most important, in particular when wireless communication is used, as thieves could set up a small fake transponder to take over responses. The MMU issues a communication similar to a "roll call" and the LMUs (or TPUs) respond saying "here and alive," possibly through secure communication or with a certificate to authenticate the response. Further, in some cases, the current flowing from the auxiliary source may be monitored for specific patterns based on reference measurements for presence of the LMUs or TPUs, in addition or by itself as verification of presence. The LMUs or TPUs may be programmed to create a specific usage pattern reflecting an ID code or other, similar unique identifier. If the results are not successful (no), the process moves to step 1007, where the software checks to see if the maximum of numbers of retries has occurred. If the retries have not reached their allowable maximum (no), the process loops back to step 1005. If the maximum number of retries has occurred (yes), the process moves to step 1008, where process 1000 sends an alarm, and then to step 1009, where it initiates other security measures, such as, for example, shutting off the LMU permanently and sounding an audible alarm (if it has the capability). Then in step 1010, the LMU goes back to sleep. If, in step 1005, the certificate exchange was found to be successful (yes), the process moves directly to step 1010, where the LMU goes back to sleep.

In some cases, in addition to a dc voltage wake-up signal, a low-frequency pilot signal may be overlaid, such as, for example, 400 Hz or similar, to indicate that this power feed from the auxiliary power unit or MMU is the theft alert wake-up and not the regular solar panel operation. Such an indication would eliminate the need to check for power from the solar panel and would immediately let the LMUs and TPUs know that this is a theft test operation.

In addition to the situation in which the LMU is disconnected from the solar array, there is a possible scenario where a solar panel is disconnected while leaving the LMU connected to the MMU. To account for this case, the LMU can be configured to monitor respective solar panels and strings for a change in resistance or capacitance. Such a change may indicate that a solar panel has been disconnected from the array and in this event, the LMU could actively notify the MMU.

EXEMPLARY PROTOCOL COMMUNICATION INFORMATION

A. Message Level
  Command Summary
  0x02—data request
  0x03—data response
  0x04—request NO DATA response
  0x05—no data response
  0x06—general parameter error response
  0x08—send broadcast request
  0x09—send broadcast response
  0x0a—send version request
  0x0b—send version response
  0x0c—set channel
  0x0d—set channel response
  0x0e—read channel
  0x0f—read channel response
  0x10—Hard reset of Gateway
  0x11—Response to hard reset
  0x12—STORE settings
  0x13—Response to STORE settings
  0x14—Set unit ID
  0x15—Set unit ID response
  0x16—Get unit ID
  0x17—Get unit ID response ------ diagnostic ------
  0x100 - Echo command

```
    0x101 - Echo response
(0x02) Get data request
    Sent to request lines of LMU data from the Gateway
    <command> = 0x02
    <body> = <line count> <seq ID>
    <line count>    Number of lines desired
                    16 bits, high byte first
    <seq ID>        Starting sequence number desired
                    <32 bits, high byte first
    Responses
        0x03 - data response
        0x05 - no data response
(0x03) Data Response
    Sent to supply LMU data to the MMU
    <response> = 0x03
    <body> = <line count> <delimiter> <LMU line> ...
    <line count>    Count of available lines
                    16 bits, high byte first
    <delimiter>     0xDDDD
                    16 bites, high byte first
    <LMU line> = ....
(0x04) Get NO data request
    Sent to request sequence number limits
    <command> = 0x04
    <body> = <empty>
    Responses
        0x05 - no data response
(0x05) No Data Response
    Sent to indicate to the MMU that the requested sequence ID
    is not yet in the buffer
    <response> = 0x05
    <body> = <Seq ID first> <Seq ID next>
    <Seq ID first>  First available Seq ID
                    32 bits, high byte first
    <Seq ID next>   "Current" Seq ID (highest + 1)
                    32 bits, high byte first
(0x06) General parameter error response
    Sent to indicate a parameter error.
    <response> = 0x06
    <body> = <empty>
(0x08) Send Broadcast Request
    Sent to load data to the beacon payload in the Gateway
    <command> = 0x08
    <body> = <ascii bytes>
    <ascii bytes>   Up to 40 ascii bytes....
    Responses
        0x09 - send broadcast response
(0x09) Send Broadcast Response
    Sent in response to a broadcast command
    <command> = 0x09
    <body> = <empty>
(0x0a) Send Version Request
    Request version and build strings
    <command> = 0x0a
    <body> = <empty>
    Responses
        0x0b - Send Version Response
(0x0b) Send Version Response
    <response> = 0x0b
    <body> = <version string> <build date> <build time>
    <version string>    Delimited ascii string (CR delimiter)
                        Typ: "Gateway Version 00.6a"
    <build date>        Delimited ascii string (CR delimiter)
                        Typ: "Build Aug 24 2009"
    <build time>        Delimited ascii string (CR delimiter)
                        Typ: "10:00:38"
(0x0c) Set Channel Request
    Sets new channel in gateway. Gateway is radio is then forcibly
    restarted with a hammer.
    <command> = 0x0c
    <body> = <desired channel>
    <desired channel>   Channel number between 11 and 26 (dec)
                        16 bit, high byte first
    Responses
        0x06 - Bad parameter response
        0x0d - Set Channel Response
(0x0d) Set Channel Response
    <response> = 0x0d
    <body> = <empty>
(0x0e) Get Channel Request
    <command> = 0x0e
    <body> = <empty>
    <current channel>   Channel number between 11 and 26 (dec)
                        16 bit, high byte first
    Responses
        0x0d - Get Channel Response
(0x0f) Set Channel Response
    <response> = 0x0d
    <body> = <current channel>
    <current channel>   Channel number between 11 and 26 (dec)
                        16 bit, high byte first
(0x10) Request Gateway Reset
    Gateway is put into hard reset
    <command> = 0x10
    <body> = <magic string>
    <magic string>      0x37249266L - arbitrary....
                        32 bit, high byte first
    Responses
        0x06 - General error response (bad magic number)
        0x11 - Get reset request Response
(0x11) Request Gateway Reset Response
    <response> = 0x11
    <body> = <empty>
    NOTE: The current gateway implementation does not manage to finish
    the answer packet before resetting.
(0x12) STORE settings
    Current parameters are formatted to a structure and written to Flash.
    A limited number of writes are allowed before the memory is filled up.
    Do NOT write to Flash unless the actions in NECESSARY
    <command> = 0x12
    <body> = <magic string>
    <magic string>      0x37249266L - arbitrary....
                        32 bit, high byte first
    Responses
        0x06 - General error response (bad magic number)
        0x13 - STORE settings response
(0x13) STORE settings response
    <command> = 0x13
    <body> = <empty>
(0x14) Set Unit ID Request
    Sets new Unit ID in gateway. Further transactions will use new ID.
    <command> = 0x14
    <body> = <magic number> <desired ID>
    <magic string>      0x37249266L - arbitrary....
                        32 bit, high byte first
    <desired id>        Desired Unit ID
                        16 bit, high byte first
    Responses
        0x06 - Bad parameter response
        0x15 - Set Unit ID Response
(0x15) Set Channel Response
    <response> = 0x15
    <body> = <empty>
(0x16) Get Unit ID Request
    <command> = 0x16
    <body> = <empty>
    Responses
        0x0d - Get Channel Response
(0x17) Get Unit ID Response
    <response> = 0x17
    <body> = <current channel>
    <current ID>        Unit ID
                        16 bit, high byte first
```

B. Packet Level

```
(MMU to Gateway):
<0x55> <0x55> <length> <Gateway ID> <command> <body>
<checksum>
    <0x55>          literal header bytes
    <length>        length - count of bytes starting with gateway ID
                    through checksum. Total length minus 4
                    16 bits, high byte first
    <Gateway ID>    Gateway address - test = 0x1235
                    16 bits, high byte first
    <command>       Command to execute
```

```
                                    16 bits, high byte first
(Gateway to MMU):
<0xAA> <0xAA> <length> <Gateway ID> <command> <body>
<checksum>
       <0xAA>           literal header bytes
       <length>         length - count of bytes starting with gateway ID
                        through checksum. Total length minus 4
                        16 bits, high byte first
       <Gateway ID>     Gateway address - test = 0x1235
                        16 bits, high byte first
       <command>        Command response
                        16 bits, high byte first
```

It is clear that many modifications and variations of the system and method disclosed herein may be made by one skilled in the art without departing from the spirit of the novel art of this disclosure. These modifications and variations do not depart from its broader spirit and scope, and the examples cited here are to be regarded in an illustrative rather than a restrictive sense.

What is claimed is:

1. A photovoltaic system comprising:
    a solar array having:
        at least one solar panel, and
        at least one respective local management unit (LMU) coupled with the at least one solar panel;
    an inverter;
    a set of DC wires connected between the at least one solar panel and the inverter;
    a power supply configured to provide power to the at least one LMU during a time period in which the solar array is not producing power; and
    a controller coupled between the set of DC wires and the power supply, the controller configured to:
        provide power from the power supply to the set of DC wires during the time period in which the solar array is not producing power, and
        suppress false starts of the inverter caused by the power provided from the power supply via the controller to the set of DC wires;
    wherein the respective LMU is configured to receive the power provided from the power supply via the controller and the set of DC wires when the solar array is not producing power;
    wherein the respective LMU is configured to maintain a specified pattern of communication with the controller; and
    wherein, if the specified pattern of communication ceases between the respective LMU and the controller after zero or more attempts by the controller fail to reestablish the specified pattern of communication with the respective LMU, the controller is configured to raise an alarm.

2. The system of claim 1 wherein the controller is selected from the group consisting of:
    a master management unit;
    a theft prevention controller; and
    a combination of a master management unit and a theft prevention unit.

3. The system of claim 1 wherein the communication comprises a secure communication.

4. The system of claim 1 wherein the power supply obtains power from at least one source selected from the group consisting of:
    a grid;
    a battery; and
    a capacitor.

5. The system of claim 1 wherein the respective LMU is not operating until it receives a wake up signal from the controller or a wake up signal from a clock internal to the respective LMU.

6. The system of claim 1 wherein the controller confirms the communication with the respective LMU by periodically polling the respective LMU.

7. The system of claim 1 wherein the controller confirms the specified pattern of communication with the respective LMU by monitoring current flow between the power supply and the solar array for a select pattern.

8. The system of claim 1, wherein:
    the respective LMU is configured to determine whether the solar panel becomes disconnected from the solar array or the solar panel becomes inoperable; and
    in response to a determination that the solar panel becomes disconnected from the solar array or the solar panel becomes inoperable, the respective LMU sends a notification to the controller.

9. The system of claim 8, wherein the determination that the solar panel becomes disconnected from the solar array or the solar panel becomes inoperable is made by detecting at least one of: a change in resistance, and a change in capacitance between the solar panel and the respective LMU.

10. The system of claim 8, wherein, upon receiving the notification by the controller, the system raises an alarm.

11. The system of claim 8 wherein the controller is selected from the group consisting of:
    a master management unit;
    a theft prevention controller; and
    a combination of a master management unit and a theft prevention unit.

12. The system of claim 8 wherein the notification comprises a secure message.

13. A method for operating a photovoltaic system comprising:
    exchanging periodic messages between a local management unit (LMU) and a controller, wherein the LMU is connected to an inverter via a set of DC wires configured to transmit, to the inverter, power generated by a respective solar panel coupled with the LMU;
    providing, by the controller, an auxiliary voltage to the set of DC wires to power the LMU when the photovoltaic system is not producing power for the inverter;
    suppressing, by the controller, false starts of the inverter caused by the auxiliary voltage;
    upon a failure of the controller to receive a specified pattern response to one or more of the periodic messages, attempting by the controller to reestablish a communication with the LMU by sending zero or more poll messages; and
    upon the controller failing to reestablish the communication, raising an alarm.

14. The method of claim 13 wherein the controller is selected from the group consisting of: a master management unit; a theft prevention controller; and a combination of a master management unit and a theft prevention unit.

15. The method of claim 13 wherein the periodic messages comprise a secure communication.

16. The method of claim 13, further comprising:
    monitoring, by the LMU, the respective solar panel; and
    upon a failure of the respective solar panel to maintain an electrical connection with the LMU, sending by the LMU a notification to the controller.

17. The method of claim 16 wherein a determination that the respective solar panel has failed to maintain the electrical connection with the LMU is made by detecting one of: a change in resistance, and a change in capacitance between the solar panel and the LMU.

18. The method of claim 16, wherein, upon receiving the notification by the controller, the system raises an alarm.

19. The method of claim 16 wherein the controller is selected from the group consisting of:
- a master management unit;
- a theft prevention controller; and
- a combination of a master management unit and a theft prevention unit.

20. The method of claim 16 wherein the notification comprises a secure message.

* * * * *